US012183910B2

United States Patent
Herlin-Boime et al.

(10) Patent No.: US 12,183,910 B2
(45) Date of Patent: Dec. 31, 2024

(54) METHOD FOR SYNTHESISING CORE-SHELL SILICON-GERMANIUM NANOPARTICLES BY LASER PYROLYSIS, METHOD FOR PRODUCING AN ELECTRODE FOR A LITHIUM BATTERY AND ASSOCIATED ELECTRODE

(71) Applicant: Commissariat A L'Energie Atomique Et Aux Energies Alternatives, Paris (FR)

(72) Inventors: Nathalie Herlin-Boime, Gif-sur-yvette (FR); Antoine Desrues, Gif-sur-yvette (FR); Florent Boismain, Gif-sur-Yvette (FR); Cédric Haon, Grenoble (FR); John Alper, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 847 days.

(21) Appl. No.: 17/253,646

(22) PCT Filed: Jun. 24, 2019

(86) PCT No.: PCT/EP2019/066717
§ 371 (c)(1),
(2) Date: Dec. 18, 2020

(87) PCT Pub. No.: WO2019/243637
PCT Pub. Date: Dec. 26, 2019

(65) Prior Publication Data
US 2021/0265624 A1 Aug. 26, 2021

(30) Foreign Application Priority Data

Jun. 22, 2018 (FR) ...................... 1855612

(51) Int. Cl.
*H01M 4/04* (2006.01)
*C23C 16/44* (2006.01)
(Continued)

(52) U.S. Cl.
CPC ....... *H01M 4/0404* (2013.01); *C23C 16/4417* (2013.01); *C23C 16/483* (2013.01);
(Continued)

(58) Field of Classification Search
CPC .... H01M 4/0404; H01M 4/366; H01M 4/386; C23C 16/4417; C23C 16/483
See application file for complete search history.

(56) References Cited

U.S. PATENT DOCUMENTS

2003/0157867 A1   8/2003   Doan
2009/0026421 A1   1/2009   Li et al.

FOREIGN PATENT DOCUMENTS

EP   2729243 A2   5/2014
FR   2998716 A1   5/2014

OTHER PUBLICATIONS

International Search Report (ISA/EP) for PCT/EP2019/066717 mailed Jul. 24, 2019 with English translation.
(Continued)

*Primary Examiner* — James Lee
(74) *Attorney, Agent, or Firm* — Alston & Bird LLP (57) ABSTRACT

Provided is method for synthesising core-shell nanoparticles by laser pyrolysis. The method may include a) conveying together a gaseous mixture including a silicon precursor and a germanium precursor in a reaction zone of a first chamber of a reactor, and b) emitting a first laser beam at the level of the reaction zone for carrying out a laser pyrolysis of the mixture, the steps making it possible to obtain nanoparticles having a core made of a silicon- and germanium-based alloy and a silicon shell.

15 Claims, 6 Drawing Sheets

(51) Int. Cl.
*C23C 16/48* (2006.01)
*H01M 4/36* (2006.01)
*H01M 4/38* (2006.01)
*B22F 1/054* (2022.01)
*B22F 1/16* (2022.01)

(52) U.S. Cl.
CPC ........... *H01M 4/366* (2013.01); *H01M 4/386* (2013.01); *B22F 1/054* (2022.01); *B22F 1/056* (2022.01); *B22F 1/16* (2022.01)

(56) References Cited

OTHER PUBLICATIONS

Written Opinion for PCT/EP2019/066717 mailed Jul. 24, 2019 with English translation.
Abdul-Malik Davies et al, *Synthesis of Yolk-Shell Structured Silicon-Germanium Anode Materials for Lithium-ion Batteries Step 3: Carbon Coating of SiGe@SiO 2*, NANO Letters Sun Z, Q; Tang, S.S. vol 12, Jan. 1, 2012, pp. 3315-3321.
Hyungki Kim, *Germanium Silicon Alloy Anode Material Capable of Tunable Overpotential by Nanoscale Si Segregation*, NANO Letters, Revised Jan. 1, 2015, pp. 4135-4142.

METHOD FOR SYNTHESISING CORE-SHELL SILICON-GERMANIUM NANOPARTICLES BY LASER PYROLYSIS, METHOD FOR PRODUCING AN ELECTRODE FOR A LITHIUM BATTERY AND ASSOCIATED ELECTRODE

CROSS-REFERENCE TO RELATED APPLICATIONS

This application is a national stage application filed under 35 U.S.C. § 371 of International Application No. PCT/EP2019/066717 filed Jun. 24, 2019, which application claims priority to French Application No. FR 1855612 filed Jun. 22, 2018, each of which is hereby incorporated by reference in its entirety.

FIELD OF THE INVENTION

The invention relates to a method for synthesising core-shell type nanoparticles by laser pyrolysis, the nanoparticles comprising silicon and germanium.

In the context of the invention, a nanoparticle is a particle of solid matter of which the size is between a few nanometres and a few hundred nanometres, said particle having dimensions of the same order of magnitude in the three directions of the space.

The invention also relates to a method for manufacturing an electrode formed from such nanoparticles for the electrochemical storage of energy.

Finally, the invention finally relates to an associated electrode.

STATE OF THE ART

Silicon represents a material which is very promising for manufacturing electrodes, and more specifically, anodes of lithium-ion batteries. Thus, the use of silicon nanoparticles in anodes has made it possible to substantially improve the storage capacity of batteries. However, two disadvantages intrinsic to silicon remain, limiting the service life of these types of batteries. The first disadvantage resides in the volume changes of silicon during its lithiation process during which a lithium/silicon alloy is formed reversibly. The second disadvantage associated with silicon is the low stability of the passivation layer, composed of degradation products of the electrolyte, which is formed at the electrolyte/silicon interface during the cycling and, which by changing volume cracks, exposing new silicon surfaces. This low stability has the direct consequence of significantly reducing the performance of the anode and of the battery during the cycling, in particular of the capacity retention of the charge.

Nanoparticles made of silicon-based alloys with metalloids such as germanium, tin or also antimony have recently been proposed. The use of germanium represents a solution of choice, as it easily forms a solid solution with the silicon. The silicon-germanium alloy-based electrodes are more stable than only silicon-based anodes. However, with the storage capacity of germanium being lower than that of silicon, the batteries obtained are of a lower capacity.

In order to limit this loss of capacity, while conserving the advantages provided by germanium, a solution would consist of developing nanoparticles having a core-shell type structure, in which the core is made of germanium and the shell is made of silicon, such that silicon remains accessible to lithium.

Hyungki et al., Nanoletters, 2015, 15, 41 have recently proposed a method for synthesising nanowires based on a silicon and germanium alloy. The synthesis of the nanowires is done during a prior VLS (Vapour-Liquid-Solid) growth step, then an annealing is carried out at 850° C. in order to allow the migration of a portion of silicon at the periphery of the nanowires. This results in nanowires with a SiGe core and at the periphery of the silicon with the existence of a composition gradient between the core and the periphery, in particular a progressive increase of the concentration of silicon to the periphery. The stability of the electrodes formed from such nanowires is improved with respect to the electrodes formed from only silicon-germanium and, together, the capacity is about 1100 mAh/g after 300 cycles at 1 C.

For all that, although the stability is improved, the charge capacity remains limited. This limitation of the capacity could be explained by the absence of a "shell" separate from the core.

The Meringher et al., Nanoscale, 2015, 7, 5186 document describes a method for synthesising core-shell type nanoparticles, in which the materials of the core of the nanoparticles (silicon- and germanium-based) are separate from the shell. The method is based on a synthesis of nanoparticles by chemical vapour deposition in a reactor comprising two zones. During a first step, silane and argon are introduced in a first zone of the reactor in order to create a flow of primary silicon particles of about 30 nm. In a second step, the flow of primary particles of the first zone is used to synthesise silicon-germanium nanoparticles. To this end, silane and germane are introduced in a second zone of the reactor. Consequently, the formation of nanoparticles is done by heterogenous nucleation from seeds, resulting in the formation of nanoparticles made of stacks of Si/Ge and/or Si/Ge/Si layers. The nanoparticles therefore have a core composed of a silicon seed on which Si or SiGe is made to grow.

It seems interesting to have a core made of a silicon-germanium alloy, i.e. a silicon- and germanium-based mixed material and the shell is made of silicon. Yet, none of the solutions proposed make it possible to obtain both nanoparticles of which the silicon-germanium core and the silicon shell are separate with a simple method, i.e. carried out in one step.

The invention makes it possible to overcome the above-mentioned disadvantages and proposes to this end a method for synthesising core-shell type nanoparticles by laser pyrolysis, said method comprising the following steps:
a) conveying together a gaseous mixture comprising a silicon precursor and a germanium precursor in a reaction zone (5) of a first chamber of a reactor,
b) emitting a first laser beam at the level of said reaction zone (5) for carrying out a laser pyrolysis of said mixture, said steps making it possible to obtain nanoparticles having a core made of a silicon- and germanium-based alloy and a silicon shell.

According to different features of the invention which can be taken together or separately:
the factor for diluting the silicon precursor in the dilution gas Gt is between 7 and 35;
the dilution gas is helium;
the silicon precursor is silane ($SiH_4$) and the germanium precursor is germane ($GeH_4$);
the first chamber 1 is under neutral gas atmosphere, said neutral gas being preferably argon;
the silicon precursor is conveyed with a flow rate d1 and the germanium precursor is conveyed with a flow rate d2, the d1/d2 ratio being between 0.19 and 4.27;

at the end of the step of synthesising nanoparticles, the following steps are carried out:

c) transporting, under a vacuum, the nanoparticles from said first chamber to a reaction zone of a second chamber of a reactor, and conveying simultaneously a carbon precursor in said second chamber, d) emitting a second laser beam having a fluence of at least 350 W/cm² at the level of the second reaction zone such that at the end of step d), the nanoparticles comprise carbon;

the carbon precursor is ethylene.

The invention also relates to a method for manufacturing an electrode formed from core-shell type nanoparticles, said method comprising the following steps:

A) synthesising the nanoparticles according to the method such as described above, B) filtering and collecting the nanoparticles formed in step A), C) dispersing the nanoparticles in a solvent to form an ink, D) coating this ink on a support, E) removing the solvent from the ink coated on the support of step C), said support being intended to form an electricity collector, F) pressing or calendering the electrode.

Advantageously step E) comprises a drying step, said method comprises, after step F), a drying step to remove any trace of the solvent.

The invention further relates to an electrode formed of core-shell type nanoparticles of which the core is made of a silicon and germanium alloy and the shell is made of silicon, the shell coating the core, the nanoparticles forming an active material of the electrode.

Advantageously, the nanoparticles are coated by a carbon layer, said carbon layer being distributed around the shell.

PRESENTATION OF THE FIGURES

Other aims, features and advantages of the invention will appear more clearly in the following description, made in reference to the appended figures, in which:

FIG. 3b illustrates the variation of the mesh parameter according to the germanium composition relative to the diffraction peaks of FIG. 3a;

DETAILED DESCRIPTION

The invention aims to synthesise core-shell type nanoparticles by laser pyrolysis, of which the core is made of a silicon and germanium alloy and the shell is made of silicon.

Figure 1:
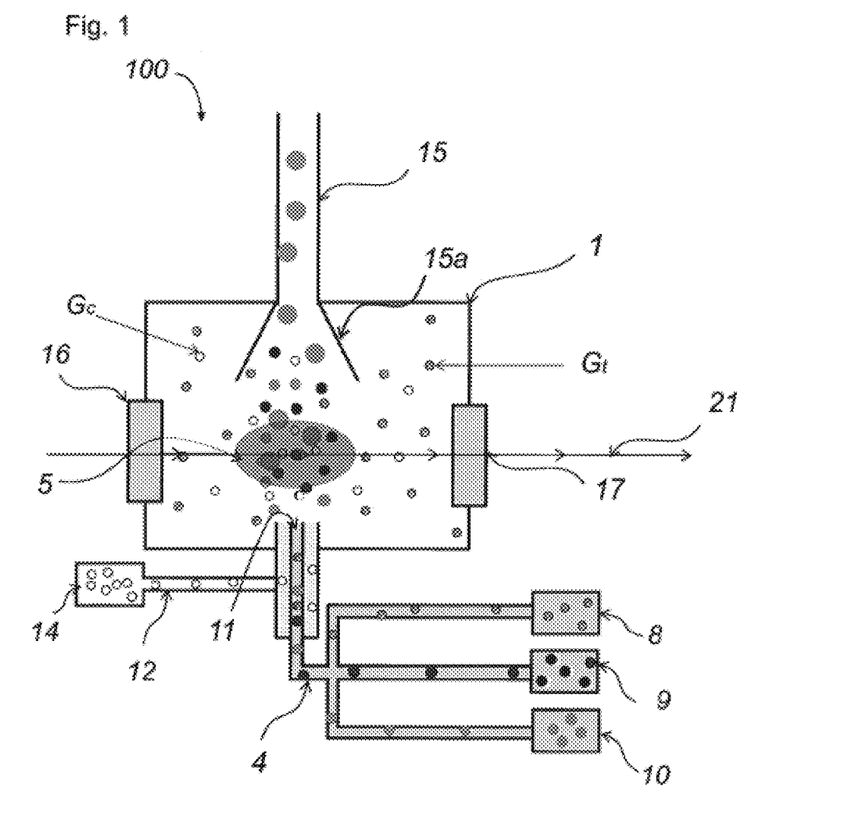
FIG. 1 schematically illustrates a reactor used for the synthesis of nanoparticles according to the method of the invention, the reactor comprising a first chamber.

To this end, the following steps are implemented:

a) conveying together a mixture M comprising a silicon precursor and a germanium precursor in a reaction zone 5 of a first chamber 1 of a reactor 100, b) emitting a first laser beam at the level of said reaction zone 5 for carrying out a laser pyrolysis of said mixture, said steps making it possible to obtain nanoparticles having a core made of a silicon- and germanium-based alloy and a silicon shell. The applicants have perceived that by carrying out the pyrolysis of the mixture M, under the abovementioned conditions, by means of the first laser beam, core-shell type nanoparticles are obtained having the desired features in a single step.

Under these conditions:

the disconnection of the silicon and germanium precursors in atomic vapours, radicals, molecular species, etc. of each element and a quick agglomeration of said vapours are favoured, leading to an aggregate made of a silicon-germanium alloy of which the composition, in terms of Si/Ge ratio, depends on the composition of the mixture M, and simultaneously, the formation of silicon on the surface is favoured, resulting in the formation of core-shell type nanoparticles having a silicon shell and a core made of silicon-germanium alloy.

Particularly advantageously, no annealing step is necessary in the method for synthesising core-shell nanoparticles according to the invention.

As will be seen below, the electrodes manufactured from these nanoparticles not only make it possible significantly improve the capacity of the batteries, but also their stability after several charging/discharging cycles.

The fluence at the level of the reaction zone 5 is an operating parameter which makes it possible to control the crystallinity of the nanoparticles, since this acts directly on the temperature of the reaction zone 5. This operating parameter is of the nature to indirectly modify the composition of the nanoparticles and, particularly in the scope of the pyrolysis of a mixture of precursors.

Moreover, it must be noted that the residence time has an impact on the nucleation kinetics and the growth of the nanoparticles. The residence time of the precursors in the first chamber 1 depends on the flow rate conditions of the mixture of precursors in said first chamber 1. These flow rate conditions can be adjusted by modifying the flow rate of each of the precursors, but also by diluting them in a suitable gas. This will be revisited in the following sections.

The two factors mentioned above (value of the fluence, residence time), impact more specifically on the structure of the nanoparticles in that they make it possible to manage the structuring of the silicon-germanium alloy at the core of the nanoparticles, and simultaneously the level of segregation of the silicon at the periphery of this core.

A reactor 100 likely to be used for the purpose of carrying out the sub-steps a) and b) and therefore the synthesis of said nanoparticles is described below.

In FIG. 1, the reactor 100 comprises a first chamber 1, in which the synthesis of the core and of the shell of the nanoparticles is carried out. The synthesis takes place in the first chamber 1 by supplying the inlet 11 with continuous flow of the mixture M.

For the purpose of the implementation of step a), the first chamber 1 is provided with an inlet 11 allowing the introduction of the mixture M. The inlet 11 is generally presented in the form of an injection nozzle. The inlet 11 is connected to a supply channel 4. This channel 4 is connected to a source 9 containing the silicon precursor, a source 10 containing the germanium precursor and a source 8 comprising a transport gas, or also as dilution gas $G_t$.

The mixture M is therefore presented in the form of a mixture of gaseous reagents comprising the silicon precursor and the germanium precursor, which are present in said mixture in variable proportions. The proportions can vary over the whole accessible range of gaseous composition. That said, in practice, the silicon precursor is still present in the mixture M, even if the respective flow rates of the two precursors can vary.

The mixture M is made from silane-type gaseous precursors, $SiH_4$, for silicon and of the germane type, $GeH_4$, for germanium. However, the method according to the invention can be achieved with other precursors. For example, hexamethyldisilazane (HDMS) can be considered for use as a silicon precursor. With this precursor being in liquid form, an aerosol generator can be used, for example piezoelectric, to generate droplets of said precursor.

Preferably, a confinement gas Go is transported into the first chamber 1 by a pipe 12 of which a portion surrounds the channel 4, said pipe 12 being also connected to a source 14 containing said confinement gas. The confinement gas Go is simultaneously transported with the mixture M into the first chamber 1.

The confinement gas $G_c$ makes it possible, on the one hand, to drain the air comprised in the first chamber in order to maintain this first chamber under neutral gas atmosphere and, on the other hand, to avoid any contact between the precursors and the walls of the chamber by confining the reaction in the zone 5. In this way, any pollution phenomenon is limited, even avoided during the formation of nanoparticles. Preferably, argon can be used for this purpose. For all that, the conditions of transporting precursors in the first chamber 1 are fixed by the flow rate conditions of the gases.

To control the residence time, it is possible to adjust the flows of the silicon and germanium precursors, only, or to dilute the reactive gases in a dilution gas $G_t$. As a non-limiting example of dilution gas, argon, helium and nitrogen can be mentioned.

In one case as in the other, the Si/Ge ratio remains adjustable by modifying the flow of the silicon precursor relative to that of the germanium precursor.

That being said, the flow rate conditions of the gases, in particular the total gas flow rate, impact the residence time of the gases in the first chamber 1, and consequently, the growth kinetics of nanoparticles. The greater the total gas flow rate is, the shorter the residence time of the reagents within the reaction zone 5 is, and the more reduced the interaction time of the reagents with the first laser beam 21 is. Conversely, the lower the total gas flow rate is, the greater the interaction time of the precursors with the first laser beam is, and the greater the residence time in the reaction zone 5 is. Therefore, it has an effect on the nucleation kinetics and, consequently, on the size of the particles.

Preferably, the flow rate conditions of the gases can be adjusted by modifying the flow of the dilution gas $G_t$ in the first chamber 1, such that the total gas flow rate obtained by summing the flow rates of the gases makes it possible to obtain the desired residence time.

Preferably, the flow rate conditions of the gases can be adjusted by considering the dilution factor of the silicon precursor, i.e. the dilution gas flow rate/silicon precursor flow rate ratio.

Indeed, the greater the dilution factor, the lower the partial pressure is. That being said, the density of the molecules per volume unit in the reaction zone 5 is decreased, and thus the probability of collision between the precursors with either of the precursors contained in the mixture M is reduced. This operating parameter therefore has a direct impact on the nucleation kinetics, as well as the size of the particles.

Preferably, the dilution factor of the silicon precursor in the dilution gas $G_t$ can be between 7 and 35.

Furthermore, this operating parameter must be correctly determined as the proportion of the dilution gas $G_t$ in the mixture M impacts the cooling time of the particles, and therefore the temperature of the reaction zone 5. Indeed, according to its nature, the dilution gas $G_t$ can accelerate or, on the contrary, delay the dissipation of the energy absorbed by the molecules. Incidentally, this can therefore impact the temperature in the reaction zone 5 and the size of the nanoparticles. For example, a sudden fall in temperature will have the consequence of stopping the growth, which will lead to the formation of smaller particles. That being said, when the proportion of dilution gas becomes greater, there are lesser effective collisions, since a portion of said collisions is done with the dilution gas. A flow rate of dilution gas $G_t$ in the first chamber 1 together with the flow rate of the mixture M makes it possible to have a better control of the temperature in the reaction zone 5.

In this regard, helium can advantageously be used as a dilution gas $G_t$, since it allows a quick cooling of the reaction zone 5 by favouring a quick dissipation of the energy absorbed by the molecules.

Simultaneously to the introduction of the mixture M in the first chamber 1 according to the abovementioned conditions, the laser pyrolysis of said mixture M is carried out during step b) to form not only the core, but also the shell of the nanoparticles.

To this end, an optical device (not illustrated) is arranged, comprising a laser capable of emitting the first laser beam 21. Said optical device is situated outside of the first chamber 1 of the reactor 100.

Preferably, said laser is arranged on a side of the first chamber 1 so as to allow an illumination of the first laser beam 21 along a secant propagation axis vertically, and, in this case, horizontally. In this regard, the first chamber 1 comprises side walls 16, 17 transparent to the first laser beam 21 to allow said laser beam 21 to pass right through it, along a substantially horizontal axis.

Another respective arrangement of said laser with respect to the reactor 100 could be provided. However, this arrangement is particularly practical to ensure that the first laser beam 21 is capable of interacting with said precursors in order to simultaneously form the core and the shell.

The laser can be a $CO_2$-type laser, typically emitting a wavelength of 10.6 microns. Other types of lasers known to a person skilled in the art for their capacity to decompose certain precursors can be considered. The first laser beam 21, of circular cross-section, has a size of several millimetres.

The laser emits at high power. More specifically, the laser can emit a laser beam 21 delivering a continuous maximum power of 2800 W, which would allow to reach incident powers per surface unit of almost 5 kW/cm² as a maximum, closer however to 2.5 kW/cm² in practice at the level of the reaction zone 5 for a beam diameter of 15 mm, for example.

The fluence acts directly on the temperature of the reaction zone 5 and impacts, in this way, not only the crystallinity of the nanoparticles, and, indirectly the composition on the surface and by volume of the nanoparticles by conserving core-shell type nanoparticles with the desired features, i.e. of which the core is made of a silicon and germanium alloy and the silicon shell is delimited from the core.

Preferably, the fluence can be of at least 100 W/cm². Advantageously, the fluence can be of at least 200 W/cm². Highly advantageously, the fluence can be of at least 300 W/cm². The fluence is the greatest control parameter of the temperature of the reaction zone.

Furthermore, the fluence is to be associated with a given flow rate of the silicon precursor, in particular as this parameter is linked to the energy absorbed, and therefore to the density of atoms of the silicon precursor per surface unit. For example, for a silane flow rate equal to 35 sccm, the fluence can be of at least 100 W/cm².

More generally, and as has already been indicated above, the flow rate of the dilution gas $G_t$ when such a gas is provided and the flow rate of the mixture M (among which the flow rate of the silicon precursor which is the greater flow rate parameter, since it is the silane which absorbs the energy supplied by the laser) have an impact on the temperature at the level of the reaction zone 5. From a practical standpoint, all this can be taken into consideration by defining a dilution ratio $R=G_t/d_1$ where $G_t$ is the flow rate of the dilution gas (He, for example) and $d_1$ is the silane flow rate. The more the dilution ratio R increases, the more the temperature cools at the level of the reaction zone 5, and vice versa. Also, it is understood that if, for example, the production flow rate of nanoparticles is sought to be increased (increase of the silane flow rate $d_1$), by conserving core-shell type nanoparticles of which the core is a silicon and germanium alloy and the core is silicon, the fluence must be increased (sometimes slightly due to the mode of radiation exchange between silane or silicon and the laser beam) at the level of the reaction zone to maintain a certain temperature level in the reaction zone 5. This temperature level in fact corresponds to the stability temperature of a considered $Si_xGe_{1-x}$ alloy, with $0<x<1$. Beyond this stability temperature, which corresponds to the solidus temperature of the phase diagram of the SiGe alloy, the separation of the Si and of the Ge is made possible, with a migration of the silicon on the surface (shell).

The melting point of germanium (Ge) is $T_1=1211K$ and the melting point of silicon (Si) is $T_2=1687K$. The stability temperature of any $Si_xGe_{1-x}$ alloy, with $0<x<1$, increases with x by remaining between $T_1$ and $T_2$.

It must further be noted that this migration is favoured due to the reducing atmosphere in the reaction zone, reducing atmosphere which is, in this case, linked to the production of dihydrogen ($H_2$) during the decomposition of the silane and of the germane.

Figure 8:
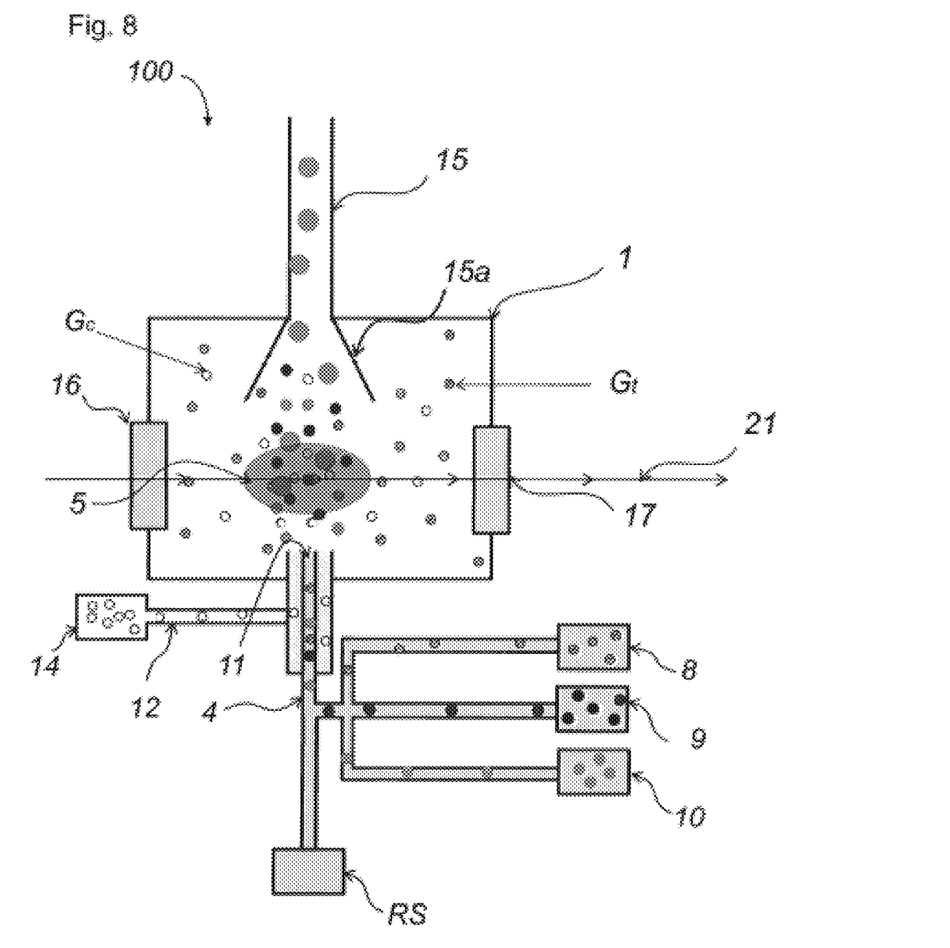
FIG. 8 is an embodiment variant of the reactor represented in FIG. 1.

If the silicon precursor and the germanium precursor do not comprise hydrogen capable of producing a reducing atmosphere, as is the case with silane or with germane, an additional gas must be supplied, for example dihydrogen ($H_2$) or ammoniac ($NH_3$) making it possible to obtain this reducing atmosphere. To this end, an additional reservoir RS can be provided, comprising such a gas, for example $H_2$ or du $NH_3$. This additional reservoir RS leads to the pipe 4 like for the different sources 8 (dilution gas), 9 (silicon precursor) and 10 (germanium precursor). It is what is represented in FIG. 8.

Once the core-shell nanoparticles are formed, they are extracted from the reactor 100 by way of a channel 15 for recovering these nanoparticles, advantageously comprising collectors equipped with filtering barriers (not represented). This recovery channel can advantageously comprise a lower portion 15a of conical shape to assist with the transfer to the zone for collecting nanoparticles.

The nanoparticles thus synthesised are collected and form a solid material.

Figure 2:
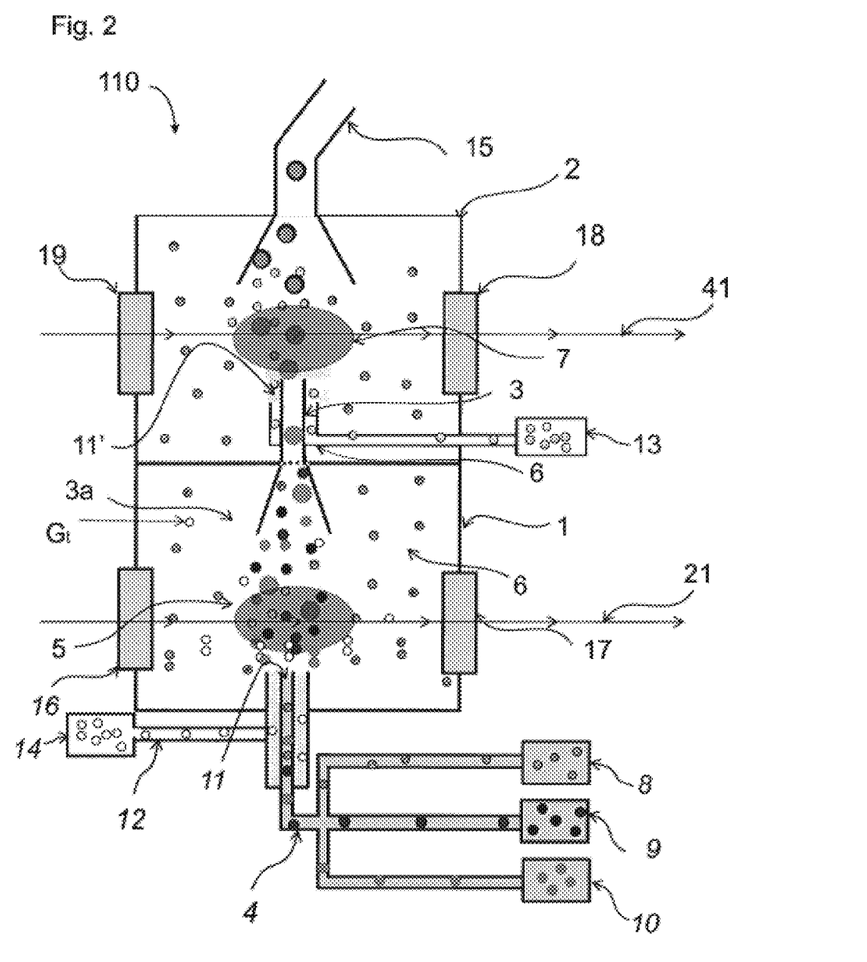
FIG. 2 illustrates a variant of the reactor of FIG. 1, comprising a second chamber.

According to a variant, the invention also relates to a method in which at the end of the step of synthesising nanoparticles, the following steps are carried out:

c) transporting, under a vacuum, the nanoparticles from said first chamber 1 to a reaction zone 7 of a second chamber 2 of a reactor 110, and simultaneously conveying a carbon precursor in said second chamber 2, d) emitting a second laser beam 41 having a fluence of at least 350 W/cm² at the level of the second reaction zone, level of said reaction zone 5 such that at the end of step d), the nanoparticles comprise carbon.

Core-shell nanoparticles made of silicon-germanium alloy are thus obtained, with a shell made of silicon which could comprise carbon. This method therefore comprises an additional step of interacting with the laser in comparison with the method described above.

For this, a reactor 110 is arranged, of which the configuration differs from the reactor 100.

In FIG. 2, the reactor 110 comprises a first chamber 1, a second chamber 2 and a communication channel 3 between the two chambers 1, 2. In this case, the reactor 110 is arranged vertically, even though the second chamber 2 is situated above the first chamber 1.

The first chamber 1 has the same features as above. The second chamber 2 is provided with an inlet 11' for a carbon precursor. Due to this, the first chamber 1 is dedicated to the synthesis of silicon-germanium core-shell nanoparticles, while the second chamber 2 is dedicated to the introduction of another element, for example, carbon.

The inlet 11' surrounds a portion of the communication channel 3 by extending collinearly with said communication channel so as to allow a radial injection of the carbon precursor.

The synthesis of core-shell type nanoparticles comprising carbon is carried out therefore successively overtime and in space.

The gaseous flow in the first chamber 1 is sufficient for assisting with the transport of nanoparticles to the second chamber 2.

The communication channel 3 is used to transmit the nanoparticles formed in the first chamber 1 in the direction of the second chamber 2. To this end, it is advantageously provided with a conical lower portion 3a.

At the same time as the transmission of nanoparticles to the second chamber 2, a carbon precursor is transported into the second chamber 2. To this end, the inlet 11' of the second chamber 2 forms an end of a supply channel 6 of this precursor, said supply channel 6 being connected to a source 13 for this precursor.

Preferably, ethylene, $C_2H_4$, can be used as a carbon precursor. However, the invention is not limited to the use of this precursor.

The nanoparticles and the carbon precursor must be mixed before a second reaction zone 7, said reaction zone being the interaction zone with a second laser beam 41. In this regard, the flow rate of the carbon precursor must preferably be controlled.

The carbon precursor is thus transported, with the nanoparticles, in the second reaction zone 7, in order to expose said nanoparticles to the carbon species.

The laser beam 41 is generated by an optical device (not illustrated), comprising a laser arranged on the side of the second chamber 2 so as to allow an illumination of the second laser beam 41 along a secant propagation axis vertically and, in this case, horizontally. To this end, the second chamber 2 comprises side walls 18, 19 transparent to the second laser beam 41, in order to allow the laser beam 41 to pass right through it, along a substantially horizontal axis.

The laser of the second chamber 2 can have similar features to the laser of the first chamber 1. However, for the purpose of disconnection of the carbon precursor and of the subsequent formation of carbon species intended to form carbon-enriched nanoparticles from nanoparticles already formed in the first chamber 1, the second laser can optionally emit a laser beam 41 delivering a continuous power greater than the first laser beam 21.

Indeed, greater incident laser powers are necessary for allowing the disconnection of the carbon precursor. As an example, an ethylene flow rate equal to 80 sccm will require an incident power per surface unit of at least 350 W/cm².

Alternatively, another arrangement of the optical device could be provided, in which a set of mirrors would allow to redirect the laser beam 21 coming from the first chamber 1 in the direction of the second chamber 2.

Once the carbon is introduced in the nanoparticles, the latter are extracted from the reactor 110 by way of a channel 15 for recovering these nanoparticles, comprising advantageously collectors equipped filtering barriers (not represented).

The nanoparticles thus synthesised are collected and form a solid material.

First embodiment example: Synthesis of nanoparticles of which the core is made of silicon-germanium alloy and the shell is made of silicon from mixtures M having variable gaseous Si/Ge ratios.

For this embodiment example, the reactor 100 is used, i.e. that represented in FIG. 1.

For the purpose of synthesising the core and the shell of the nanoparticles, silane is used as a silicon precursor, while germane is used as a germanium precursor.

These two precursors are introduced in the first chamber 1 according to the flow rates and the proportions indicated in the table below. Each test is carried out separately, i.e. that each gaseous Si/Ge ratio leads to a sample.

| Sample | SiH$_4$ flow rate (sccm) | GeH$_4$ flow rate (sccm) | Si/Ge (gaseous ratio) |
| --- | --- | --- | --- |
| Sibat 204 | 70 | 0 | — |
| Sibat 191 | 47 | 11 | 4.27 |
| Sibat 198 | 35 | 33 | 1.05 |
| Sibat 203 | 25 | 55 | 0.45 |
| Sibat 193 | 15 | 77 | 0.19 |

At the same time, helium, used here as a transport/dilution gas and argon, used as a confinement gas, are introduced with silicon and germanium precursors.

The helium flow rate is selected such that the total flow rate of the gases is equal to 600 sccm. This flow rate makes it possible to ensure a constant flow of precursors within the reactor 100, knowing that the diameter of the inlet 11 (circular orifice) is 2 mm.

The first chamber 1 is maintained at constant pressure, close to atmospheric pressure. The chamber is filled with argon, which makes it possible to avoid parasitic reactions.

The laser emits a continuous laser beam 21, the power of which is 1050 W, to which is associated a certain focalisation, making it possible to obtain a surface power of 280 W/cm² (fluence) for all the tests carried out.

Simultaneously to the introduction of the mixture M and of the helium in the first chamber 1, the pyrolysis of said mixture is carried out, for each gaseous composition mentioned above.

The temperatures in the reaction zone 5 are respectively about 1900K (Sibat 191), 1690K (Sibat 198), 1480K (Sibat 203) and 1410K (Sibat 193).

All these temperatures are above the stability temperature of the silicon-germanium alloy considered.

Thus, nanoparticles are obtained, of which the core is made of silicon-germanium and the shell mainly made of silicon, which are then recovered at the outlet of the recovery channel 15.

Figure 3A:
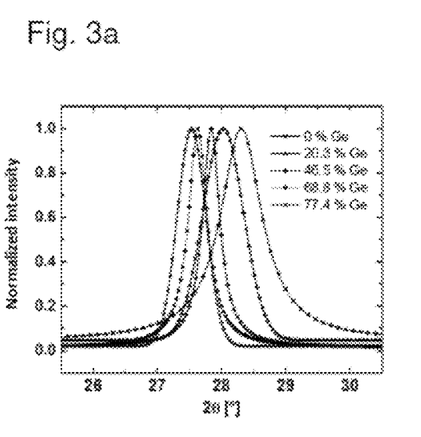
FIG. 3a illustrates the movement of the diffraction peak (100) of different silicon-germanium alloys, according to their germanium composition which varies between 0% and 77.4%.

In FIG. 3a, the movement of the diffraction peak (100) of the nanoparticles is illustrated, according to their germanium composition. The measurements have been made by diffraction of X-rays.

The germanium composition varies between 0% and 77.4% as the Si/Ge ratio decreases. By that, this means that the sample having an Si/Ge ratio=4.27 has a germanium ratio (at %) of 20.3%, the sample having an Si/Ge ratio=1.05 has a germanium ratio of 46.5%, and so on.

The position of the diffraction peak moving to lower diffraction angles can be clearly seen, according to what is expected with the insertion of germanium in the crystalline network of silicon (it must be noted that the silicon crystallises in a cubic network with a centred face).

Figure 3B:
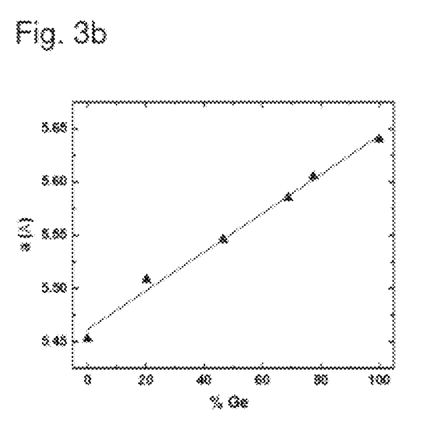

This phenomenon can be better understood upon reading FIG. 3b, in which the mesh parameter can be seen to linearly increase as the germanium ratio increases.

Figure 4:
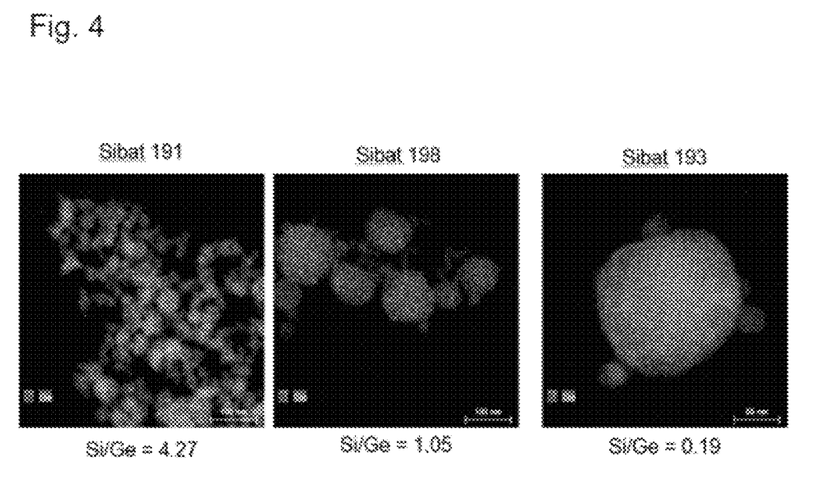
FIG. 4 illustrates STEM/EDX images of silicon-germanium nanoparticle-based materials having an Si/Ge ratio=4.27 (image on the left), an Si/Ge ratio=1.05 (image in the centre) and an Si/Ge ratio=0.19 (image on the right)

In FIG. 4, images of silicon-germanium nanoparticles obtained by electron scanning microscopy by transmission coupled with a dispersive energy analysis (STEM/EDX) are illustrated. Only the STEM/EDX images of the samples having a Si/Ge ratio=4.27 (image on the left), Si/Ge=1.05 (image in the centre) and Si/Ge=0.19 (image on the right) are illustrated.

These images show that despite the average representation of the mesh illustrated in FIG. 3b, certain local inhomogeneities exist within the samples. Indeed, the presence of the silicon shell around the core made of silicon-germanium mixed alloy is observed, and this whatever the gaseous Si/Ge ratio considered.

Figure 5A:
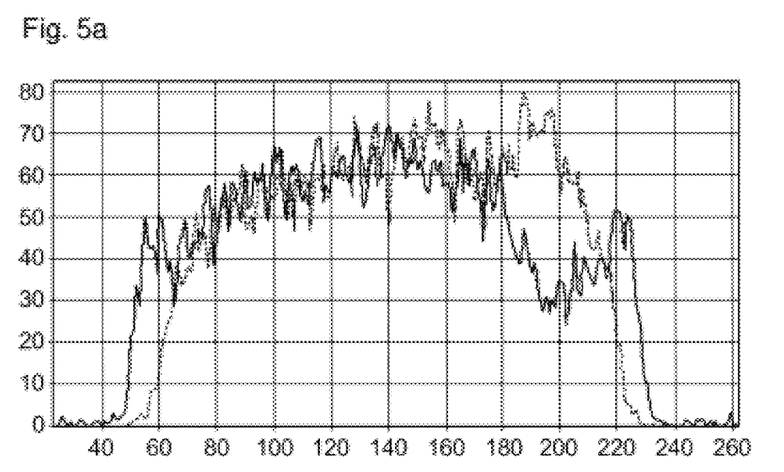
FIG. 5a illustrates the normalized concentration profiles of silicon and germanium in a silicon-germanium nanoparticle having a Si/Ge ratio=1.05, the germanium profile is illustrated in green, and the silicon profile, in orange.

In FIG. 5a the normalized concentration profiles of silicon and germanium in a synthesised silicon-germanium nanoparticle with an Si/Ge ratio=1.05 in the gaseous flow are illustrated.

Three separate zones are distinguished in the composition profiles of the nanoparticle used to take this measurement. A relatively constant zone in terms of silicon (orange) and germanium (green) composition in the centre of the profile and two peripheral zones of the profile in which the silicon ratio increases and the germanium ratio decreases. In the peripheral zones, the germanium concentration can be seen starting to decrease before the silicon concentration.

Figure 5B:
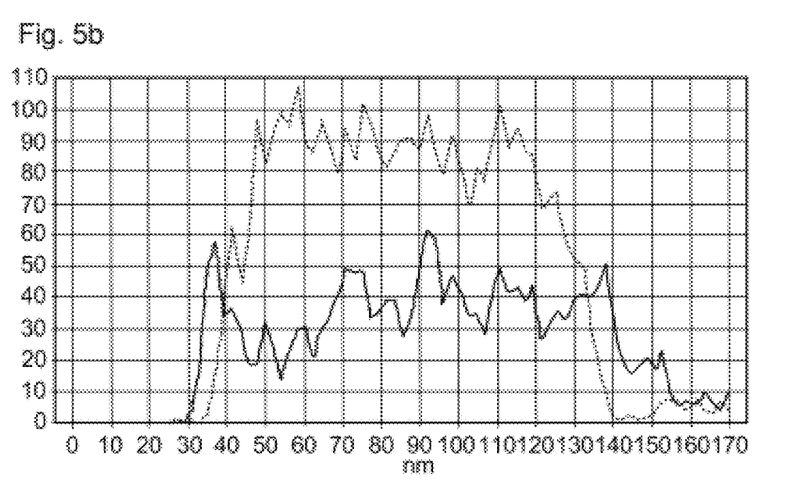
FIG. 5b illustrates the concentration profiles of FIG. 5a as an absolute value, the germanium profile is illustrated in green, and the silicon profile, in orange.

For good reason, in FIG. 5b, where the concentration profiles of FIG. 3a are illustrated as an absolute value, the silicon concentration can very clearly be seen becoming predominant in the peripheral zones of the profile, indicating the existence of a silicon shell at the edge of the mixed composition core. In the profile illustrated in FIG. 5b, the nanoparticle makes a diameter of about 130 nm in total and has a core of 100 nm in diameter and a shell of about 15 nm thick.

Second embodiment example: Synthesis of silicon-germanium core-shell nanoparticles with the addition of carbon.

In this embodiment example, the reactor 110 is used, i.e. that represented in FIG. 2.

For the purpose of synthesising nanoparticles, of which the core is made of silicon-germanium alloy and the shell is made of silicon, an identical manner is proceeded with to that of the first embodiment example.

The nanoparticles formed in the first chamber 1 are then transported, under a vacuum, in the second chamber 2 via the communication channel 3 and the inlet 11' in order to introduce the carbon.

To this end, ethylene, initially stored in the source 13, is conveyed to the second chamber 2 via the supply channel 6 and the inlet 11'.

The inlet 11', of a diameter of 10 mm (circular orifice), is adapted to support an ethylene flow rate of 700 sccm and the continuous flow of production of nanoparticles.

The second laser delivers a laser beam 41 of which the continuous laser power is 1390 W, of which the absorption by the ethylene flow makes it possible to disconnect the molecules and form carbon species.

The carbon species thus formed are agglomerated around the nanoparticles arriving in the second chamber 2 and thus enrich the silicon shell with carbon.

At the end of this step, the nanoparticles obtained have a core made of silicon-germanium alloy and a silicon shell and are carbon-enriched.

The invention also relates to a method for manufacturing an electrode formed from core-shell type nanoparticles, such as described above.

The method for manufacturing the electrode comprises the following steps:
  A) synthesising the nanoparticles according to the methods described above,
  B) filtering and collecting the nanoparticles formed in step A),
  C) dispersing the nanoparticles in a solvent to form an ink,
  D) coating this ink on a support,
  E) removing the solvent from the ink coated on the support of step C), said support being intended to form an electricity collector,
  F) pressing or calendering the electrode.

Steps C) to F) are conventional steps for manufacturing an electrode. As an example, French application FR 2 998 716 can be referred to, which describes such a manufacturing method.

The invention further relates to an electrode formed of core-shell type nanoparticles, of which the core is made of a silicon and germanium alloy and the shell is made of silicon.

The nanoparticles are such that their core is made of silicon-germanium and that the silicon shell coats the core homogenously.

In addition, the nanoparticles are such that the silicon-germanium alloy core is separate from the silicon shell.

In other words, the composition of the core is relatively homogenous by volume in the whole core and to the zone delimiting the shell, while the shell is mainly made of silicon. By "mainly made of silicon", this means that the shell has a silicon concentration greater than that of germanium.

Such a configuration makes it possible to substantially improve the capacity and the stability of the manufactured electrodes.

Preferably, the nanoparticles have a generally spherical shape.

Preferably, also the nanoparticles have a diameter of less than 150 nm.

The size of the nanoparticles plays an important role in the stability of electrodes manufactured from said nanoparticles. Beyond a threshold particle size, typically of the order of 150 nm, the silicon surface layer cracks progressively during its lithiation.

Preferably, the shell has a thickness between 5 and 10 nm.

Advantageously, the nanoparticles can comprise carbon. The electrodes manufactured from such nanoparticles have stabler charge capacities over time, in particular during the cycling.

Embodiment example of an electrode and characterisation: Manufacturing an electrode formed of core-shell nanoparticles of which the core is made of a silicon-germanium alloy and the shell is made of silicon, with and without a carbon layer and characterisation.

Electrodes have been manufactured, formed of nanoparticles such as synthesised in the first and second embodiment example, both having an Si/Ge ratio=1.05, and electrodes from only silicon material.

The capacity and the retention of the charge capacity of the electrodes obtained during the cycling have been measured in order to evaluate the performance of such electrodes.

The samples used to carry out these tests are half-cells, i.e. that their lithium counter electrode is metallic. The cycle speed of C/5, i.e. a charge and a discharge in 5 hours.

Figure 6:
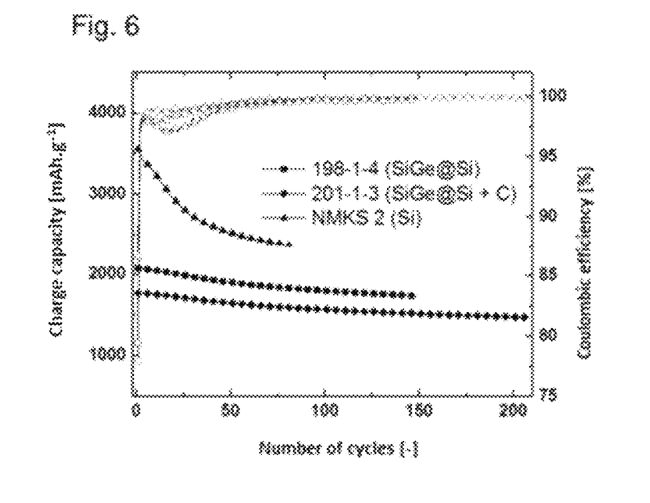
FIG. 6 illustrates the capacity of the charge obtained and the associated coulombic efficiency according to the number of cycles for synthesised nanoparticles with an Si/Ge ratio=1.05, with (201) and without carbon (198) and a sample with silicon nanoparticles (NMKS 2)

FIG. 6 illustrates the evolution of the charge capacity (solid symbols) obtained and the associated coulombic efficiency (hollow symbols) according to the number of cycles for particles of a close size.

The coulombic efficiency is defined here by the ratio between the delithiated capacity of the material on the lithiated capacity of said material, namely the proportion reversibly lithiated within the material. This coulombic efficiency can be determined at each cycle.

For nanoparticles such as described above, the calculated capacity of the electrodes obtained is 2669 mAh/g, while for nanoparticles comprising, in addition, a carbon layer, this calculated capacity goes to 2556 mAh/g.

As can be seen in FIG. 6, a coulombic capacity of 78% is reached at the first cycle for a silicon-germanium/silicon-based electrode and of 72% with the addition of carbon. After a few cycles (that is about 10 cycles), their coulombic efficiency is clearly greater than 99%.

It is interesting to observe that for the silicon-germanium/silicon-based electrodes, with and without a surface carbon layer, the coulombic efficiency is stabilised more quickly than for only the silicon-based electrode. The presence of carbon on the surface of the nanoparticles, accelerates the stabilisation of the coulombic efficiency even more.

In addition, the results of this study are better than those generally obtained for the electrodes formed of silicon-germanium nanoparticles. Indeed, the initial capacity for the silicon-germanium/silicon-based electrode is greater than 2000 mAh/g.

In addition, also, the capacity retention of the charge is important since it is 87% after 100 cycles.

Moreover, as can be observed in FIG. 6, although the initial capacity for only the silicon-based electrode is clearly greater than that of the silicon-germanium/silicon sample, the capacity retention of the charge is also clearly lower since it is 70% after only 50 cycles.

With the addition of carbon, the maximum capacity decreases since it does not occur in the galvanostatic cycling, and the capacity retention is 89% after 100 cycles.

Figure 7:
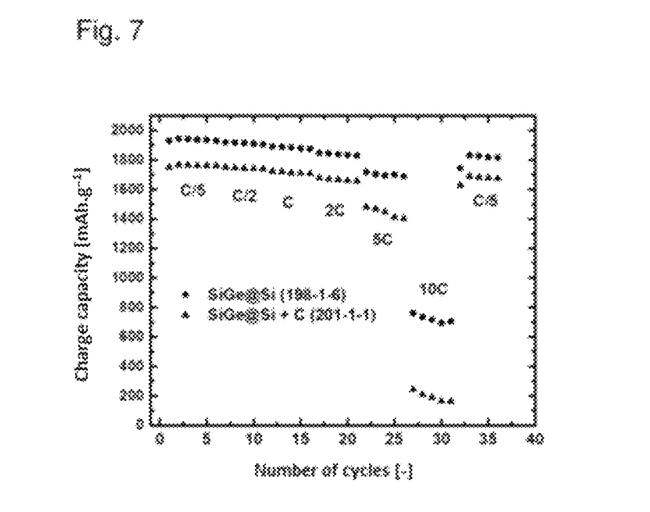
FIG. 7 illustrates charge capacities obtained at high cycling speeds for electrodes formed of synthesised nanoparticles with an Si/Ge ratio=1.05, with and without carbon.

In FIG. 7, the electrochemical performance is studied for high cycling speeds for electrodes formed of synthesised nanoparticles with a gaseous Si/Ge ratio=1.05, with and without carbon.

The capacity retention of the charge is high, even when speeds as high at 5 C are applied. These electrochemical results are better than in the state of the art.

The invention claimed is:

1. A method for synthesising core-shell type nanoparticles by laser pyrolysis, said method comprising the following steps:
    a) conveying together a gaseous mixture comprising a silicon precursor and a germanium precursor in a reaction zone of a first chamber of a reactor; and
    b) emitting a first laser beam at a level of said reaction zone at a temperature strictly greater than a stability temperature of a silicon- and germanium-based alloy for carrying out a laser pyrolysis of said mixture to effect outward migration of silicon to form nanoparticles having a core made of a silicon- and germanium-based alloy and a silicon shell.

2. The method according to claim 1, wherein the first laser beam has, at the level of said reaction zone, a fluence of at least 100 W/cm$^2$.

3. The method according to claim 1, wherein the mixture comprises a dilution gas, the presence of said dilution gas defining a dilution factor of the silicon precursor in said dilution gas between 7 and 35.

4. The method according to claim 3, wherein the dilution gas is helium.

5. The method according to claim 1, wherein the first chamber is under neutral gas atmosphere ($G_c$).

6. The method according to claim 1, wherein the silicon precursor is conveyed with a flow rate d1 and the germanium precursor is conveyed with a flow rate d2, the d1/d2 ratio being between 0.19 and 4.27.

7. The method according to claim 1, wherein step b) is carried out under reducing atmosphere, at least at the level of said reaction zone.

8. The method according to claim 1, wherein the silicon precursor is silane (SiH$_4$) and the germanium precursor is germane (GeH$_4$).

9. The method according to claim 1, wherein at the end of synthesising the nanoparticles, the method further comprises:
    c) transporting, under a vacuum, the nanoparticles from said first chamber to a reaction zone of a second chamber of a reactor, and simultaneously conveying a carbon precursor in said second chamber; and
    d) emitting a second laser beam having a fluence of at least 350 W/cm$^2$ at a level of the second reaction zone such that at the end of step d), the nanoparticles comprise carbon.

10. The method according to claim 9, wherein the carbon precursor is ethylene.

11. The method according to claim 1, wherein the first laser beam has, at the level of said reaction zone, a fluence of at least 200 W/cm$^2$.

12. The method according to claim 1, wherein the first laser beam has, at the level of said reaction zone, a fluence of at least 300 W/cm$^2$.

13. A method for manufacturing an electrode formed from core-shell type nanoparticles, said method comprising the following steps:
    A) synthesising the nanoparticles according to the method of claim 1,
    B) filtering and collecting the nanoparticles formed in step A),
    C) dispersing the nanoparticles in a solvent to form an ink,
    D) coating said ink on a support,
    E) removing the solvent from the ink coated on the support of step C), said support configured to form an electricity collector,
    F) pressing or calendering the electrode.

14. The method according to claim 13, wherein step E) comprises a drying step.

15. The method according to claim 13, comprising after step F), a drying step for removing any trace of the solvent.

* * * * *